United States Patent
Wang (10) Patent No.: US 8,293,663 B2
(45) Date of Patent: *Oct. 23, 2012

(54) CCD SENSORS WITH MULTIPLE CONTACT PATTERNS

(75) Inventor: Shen Wang, Webster, NY (US)

(73) Assignee: Truesense Imaging, Inc., Rochester, NY (US)

(*) Notice: Subject to any disclaimer, the term of this patent is extended or adjusted under 35 U.S.C. 154(b) by 210 days.

This patent is subject to a terminal disclaimer.

(21) Appl. No.: 12/845,796

(22) Filed: Jul. 29, 2010

(65) Prior Publication Data

US 2012/0028400 A1    Feb. 2, 2012

(51) Int. Cl.
*H01L 21/00* (2006.01)

(52) U.S. Cl. .................................................. 438/800

(58) Field of Classification Search .................. None
See application file for complete search history.

(56) References Cited

U.S. PATENT DOCUMENTS

| | | | |
|---|---|---|---|
| 4,580,160 A | 4/1986 | Ochi et al. | |
| 5,194,751 A | 3/1993 | Yonemoto et al. | |
| 5,506,429 A | 4/1996 | Tanaka et al. | |
| 5,790,092 A * | 8/1998 | Moriyama | 345/96 |
| 5,907,359 A | 5/1999 | Watanabe | |
| 6,342,876 B1 * | 1/2002 | Kim | 345/87 |
| 6,781,568 B2 * | 8/2004 | Nishimura et al. | 345/96 |
| 2003/0151075 A1 | 8/2003 | Shizukuishi | |
| 2003/0214595 A1 | 11/2003 | Mabuchi | |
| 2010/0073337 A1 * | 3/2010 | Tsubata | 345/204 |

FOREIGN PATENT DOCUMENTS

| | | |
|---|---|---|
| EP | 0409174 | 1/1991 |
| EP | 0641026 | 3/1995 |
| EP | 0858112 | 8/1998 |

OTHER PUBLICATIONS

International Search Report and Written Opinion mailed Sep. 16, 2011 for International Application No. PCT/US2011/044472 (12 pages).
International Search Report and Written Opinion mailed Sep. 16, 2011 for International Application No. PCT/US2011/045168 (13 pages).
International Search Report and Written Opinion mailed Oct. 4, 2011 for International Application No. PCT/US2011/045161 (11 pages).
International Search Report and Written Opinion mailed Sep. 16, 2011 for International Application No. PCT/US2011/044502 (11 pages).

* cited by examiner

*Primary Examiner* — Scott B Geyer
(74) *Attorney, Agent, or Firm* — Bingham McCutchen LLP (57) ABSTRACT

A pixel array in an image sensor includes multiple pixels. The pixel array includes vertical shift registers for shifting charge out of the pixel array. The vertical shift registers can be interspersed between the pixels, such as in an interline image sensor, or the photosensitive areas in the pixels can operate as vertical shift registers. The pixels are divided into blocks of pixels. One or more electrodes are disposed over each pixel. Conductive strips are disposed over the electrodes. Contacts are used to connect selected electrodes to respective conductive strips. The contacts in at least one block of pixels are positioned according to one contact pattern while the contacts in one or more other blocks are positioned according to a different contact pattern. The different contact patterns reduce or eliminate visible patterns in the contact locations.

7 Claims, 12 Drawing Sheets

CCD SENSORS WITH MULTIPLE CONTACT PATTERNS

TECHNICAL FIELD

The present invention relates generally to image sensors for use in digital cameras and other types of image capture devices, and more particularly to Charge-Coupled-Device (CCD) image sensors.

BACKGROUND

A CCD image sensor typically includes an array of photosensitive areas that collect charge carriers in response to light striking each photosensitive area. For an interline transfer sensor, the charge is transferred from the photosensitive areas to vertical shift registers. The vertical shift registers shift the charge in parallel one row at a time to a horizontal shift register. The horizontal shift register then serially shifts the charge to an output circuit.

Figure 1:
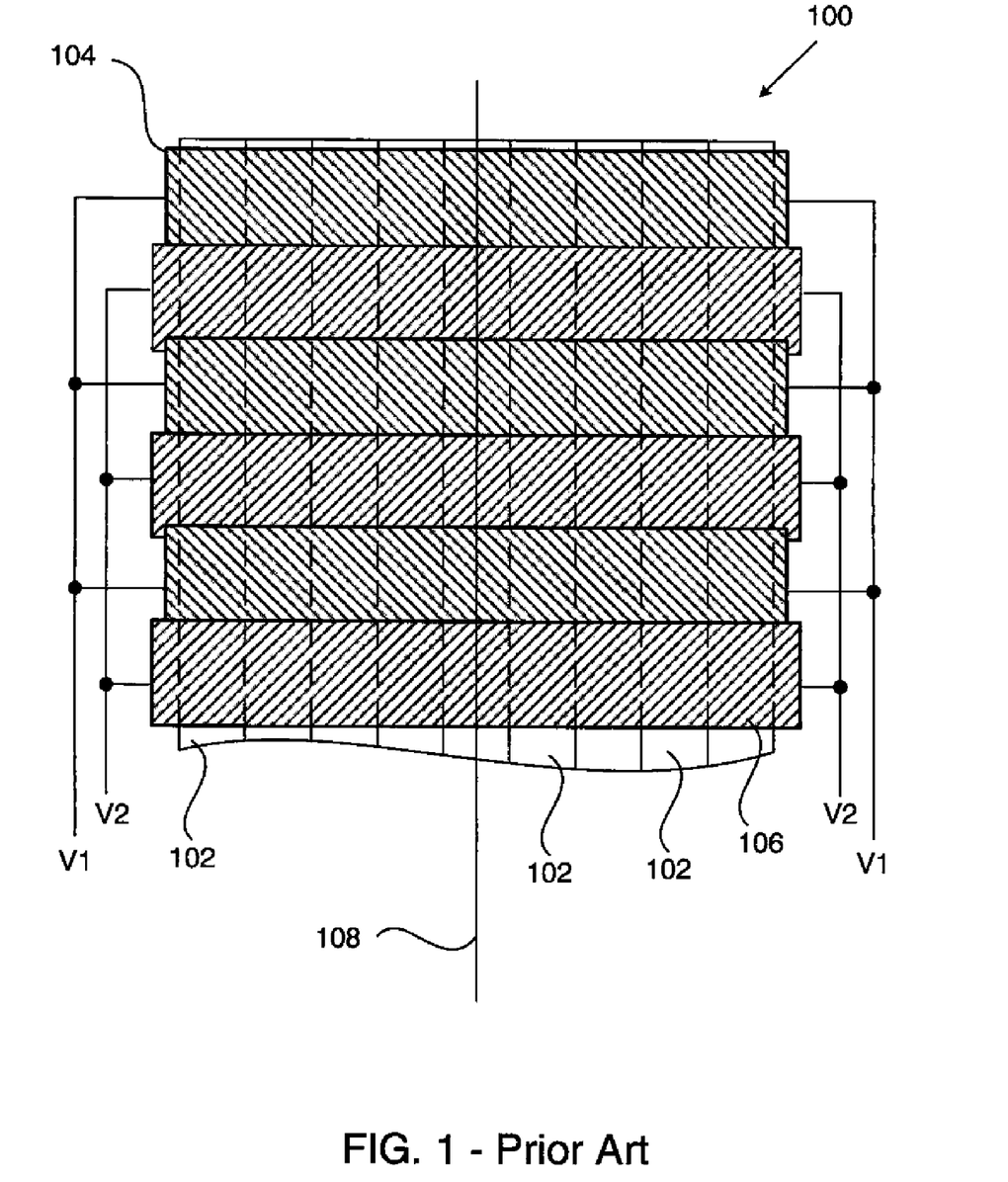
FIG. 1 is a simplified top view of a portion of a first full frame pixel array according to the prior art.

With a full frame transfer image sensor, the photosensitive areas also operate as vertical shift registers. The charge is shifted in parallel one row at a time from the vertical shift registers to the horizontal shift register. FIG. 1 is a simplified top view of a portion of a first full frame pixel array according to the prior art. Pixel array 100 includes multiple photosensitive areas 102. Electrodes or gates 104, 106 are disposed over the photosensitive areas in an alternating pattern. To shift charge through the photosensitive areas, a vertical driving pulse V1 is applied to electrodes 104 and a vertical driving pulse V2 is applied to electrodes 106. Typically the driving pulses V1, V2 are applied at both ends of the electrodes 104, 106.

Typically electrodes 104 are formed by a first polysilicon layer and electrodes 106 by a second polysilicon layer. Polysilicon is known to have a relative high resistance. This high resistance causes the waveforms of the driving pulses V1, V2 to deteriorate as the driving pulses V1, V2 propagate away from the ends of the electrodes toward the center or middle (represented by line 108) of array 100. This problem becomes worse as the size of the array increases.

Figure 2:
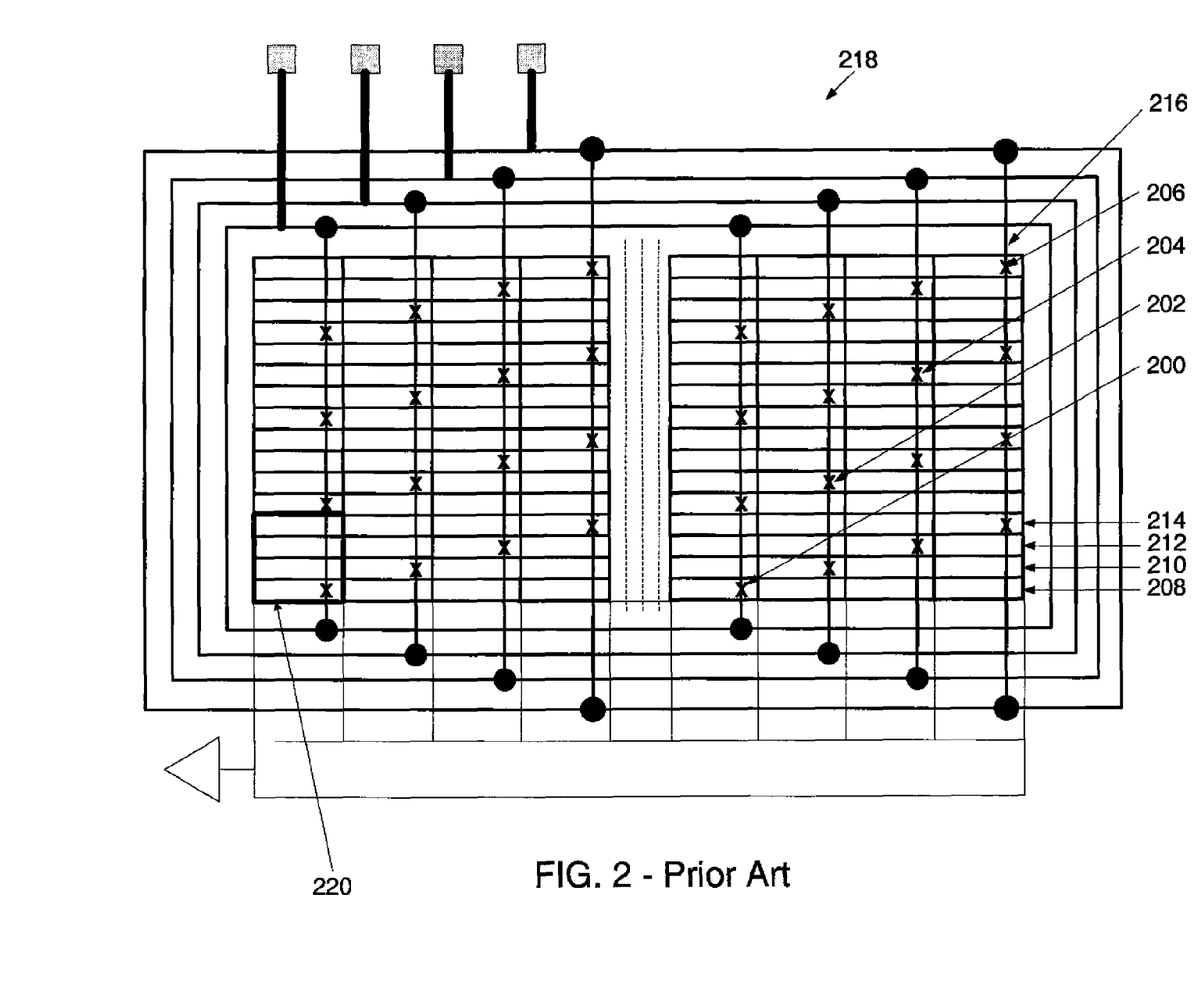
FIG. 2 is a simplified top view of a portion of a second full frame pixel array according to the prior art.

Several different techniques have been developed to address the issue of signal deterioration across electrodes. For example, U.S. Pat. No. 5,194,751 includes a metal wiring layer that is connected to the electrodes through contact regions. FIG. 2 is a simplified top view of this second prior art construction. Contact regions 200, 202, 204, 206 between respective electrodes 208, 210, 212, 214 and the metal wiring 216 are arranged in an orderly fashion throughout the array 218. Instead of applying the driving pulses to the ends of the electrodes 208, 210, 212, 214, the driving pulses are applied to the metal wiring layer 216. Thus, the driving pulses are applied to electrodes 208, 210, 212, 214 at the various contact regions distributed throughout the array 218. One concern with this design is that the orderly contact pattern is susceptible to detection by human eyes when a CCD image sensor is illuminated by a bright light. This is due to interaction between the contacts between layers and the light.

Another concern is the density of contact regions 200, 202, 204, 206. In recent years, the trend of image sensor design is to increase the number of pixels and to shrink the pixel size. This means contact regions 200, 202, 204, 206 are formed closer together, increasing the probability for adjacent contact regions to short together. As shown in FIG. 2, each pixel 220 in array 218 includes one contact region. Thus, in each row of pixels, a contact region in one pixel 220 is immediately adjacent to, and diagonally offset from, the contact region in a neighboring pixel. This pattern can increase the percentage of—electrical shorts between electrodes. Electrical shorts between the contact regions reduce the manufacturing yield of image sensors and increase the cost to produce image sensors. On the other hand, if the density of the contact regions is too sparse, the benefit of reduced signal deterioration decreases because the driving pulses must propagate a greater distance between contact regions on each electrode.

Figure 3:
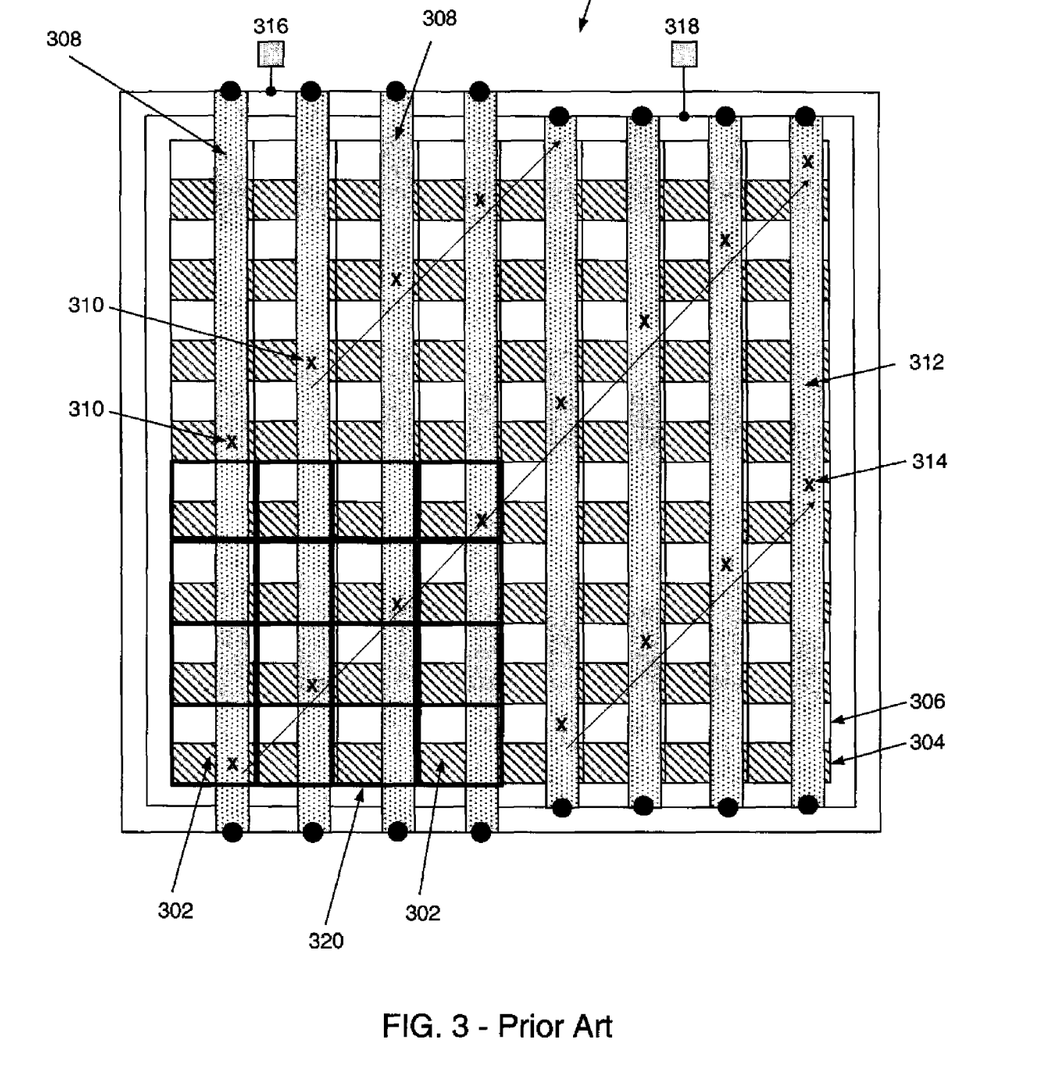
FIG. 3 is a simplified top view of a portion of a third full frame pixel array according to the prior art.

FIG. 3 is a simplified top view of a portion of a third full frame image sensor according to the prior art. Two electrodes 304, 306 are disposed over each pixel 302. Electrodes 304 are connected to metal strips 308 via contacts 310, and electrodes 306 are connected to metal strips 312 via contacts 314. The driving pulses are applied to pads 316, 318 and to electrodes 304, 306 at the various contacts 310, 314 distributed throughout the array 300. This reduces the propagation delays of the driving pulses to the middle or center of the electrodes 304, 306.

As shown in FIG. 3, four adjacent metal strips are connected to the same pad 316, 318. This is an improvement over the FIG. 2 construction in terms of reducing electrical shorts between adjacent contacts because any short between adjacent metal strips within the four strips is not an issue since the four strips are all connected to the same pad. Another feature of the FIG. 3 design is that within each four-by-four (4×4) block 320 of pixels 302, the contacts within that block 320 are connected to the same electrode. Pixel array 300 has only one contact to a respective electrode in each single row and each single column in block 320 and any two contacts are not adjacent to each other. By reducing the contact density, the FIG. 3 design reduces the frequency of the shorts. However, since each contact is placed diagonally across pixel array 300 (as shown by the three diagonal arrows), the pattern of the contacts in array 300 is still susceptible to detection by the human eye when illuminated by bright light.

Figure 4:
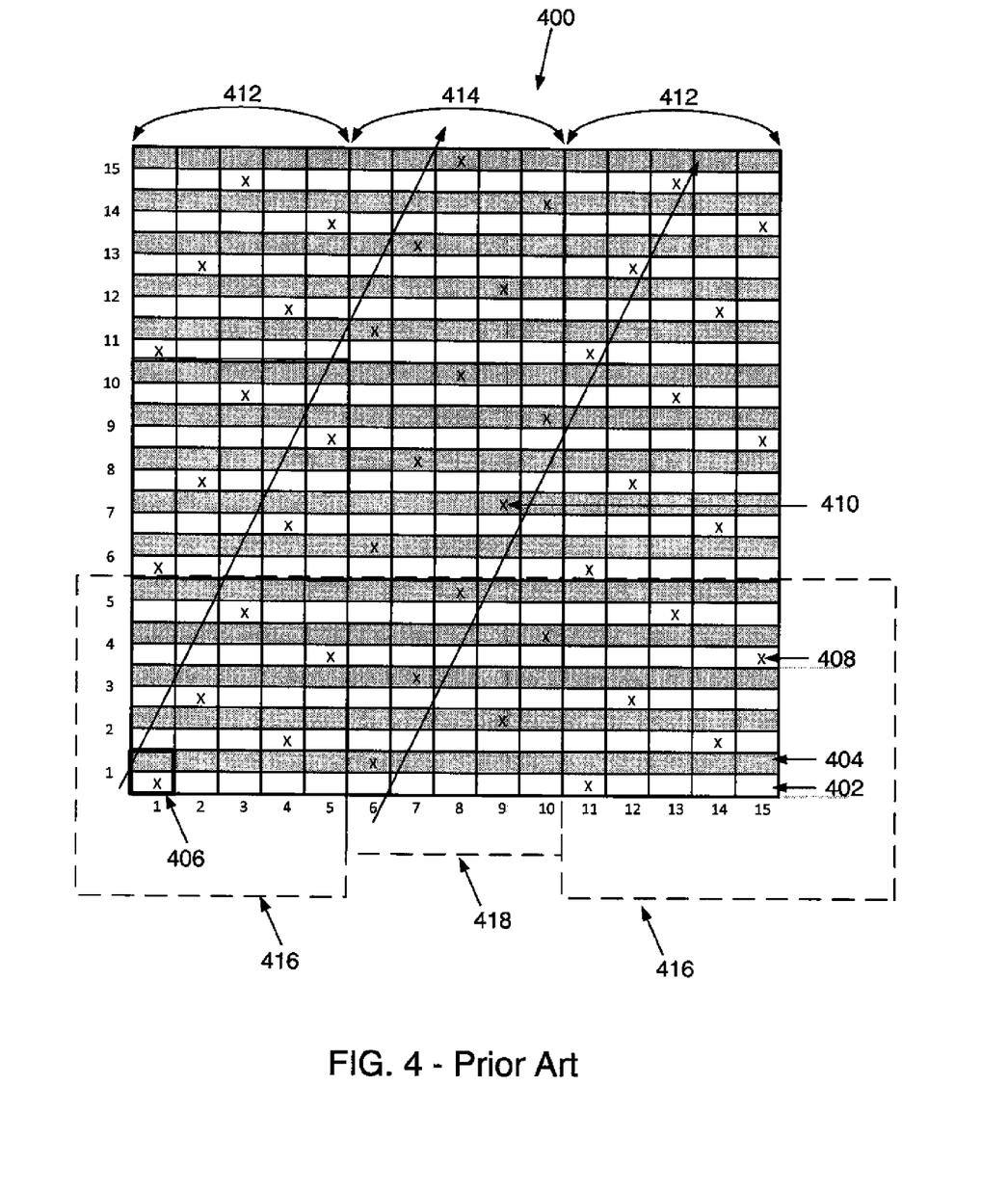
FIG. 4 is a simplified top view of a portion of a fourth full frame pixel array according to the prior art.

FIG. 4 is a simplified top view of a portion of a fourth full frame pixel array in accordance with the prior art. Pixel array 400 includes electrodes 402, 404 disposed over each pixel 406 in array 400. Contacts 408, 410 connect respective electrodes 402, 404 to a metal strip (not shown in FIG. 4). All of the contacts 408 disposed in column group 412 are connected to electrode 402, while the contacts 410 in column group 414 are connected to electrode 404. Within each five-by-five block 416 of pixels in column group 412, a contact 408 to electrode 402 is formed in row 1 and column 1; row 2 and column 4; row 3 and column 2; row 4 and column 5; and row 5 and column 3. This pattern of contacts in block 416 is fixed and repeats, or is tiled, across column group 412. The same contact pattern is used for the contacts 410 to electrode 404 in column group 414 (see block 418). The two contact patterns produce a diagonal pattern of contacts that can be easily seen (shown by two diagonal arrows in pixel array 400). The contact patterns produce image artifacts in an image captured by pixel array 400 when the pixel array is illuminated under a bright light.

SUMMARY

A pixel array in an image sensor includes multiple pixels. The pixel array includes vertical shift registers for shifting charge out of the pixel array. The vertical shift registers can be interspersed between the pixels, such as in an interline image sensor, or the photosensitive areas in the pixels can operate as vertical shift registers. The pixels are divided into blocks of pixels. The blocks of pixels include two or more pixels in one embodiment in accordance with the invention. One or more electrodes are disposed over each pixel. Conductive strips are disposed over the electrodes. Contacts are used to connect selected electrodes to respective conductive strips. The contacts in at least one block of pixels are positioned according to one contact pattern while the contacts in one or more other blocks are positioned according to a different contact pattern. The different contact patterns reduce or eliminate visible patterns in the contact locations.

One method for determining contact locations in a pixel array first groups all of the pixels in the pixel array into blocks of two or more pixels. Different contact patterns are then used in substantially all of the blocks. For example, in one embodiment in accordance with the invention, a contact pattern is randomly generated for each block.

Another method for determining contact locations in a pixel array first groups a portion of the pixels in the pixel array into two or more blocks of pixels. Different contact patterns are then used in substantially all of the blocks. For example, in one embodiment in accordance with the invention, a contact pattern is randomly generated for each block. The blocks, and the contact patterns contained therein, are then tiled over the entire pixel array.

And yet another method for determining contact locations in a pixel array uses a first contact pattern for all of the contacts in the pixel array. The first contact pattern can be any known or given contact pattern. The pixel array is then grouped into blocks of pixels. Block locations within the pixel array are selected and a different (second) contact pattern is used in the selected block locations. Each of the selected block locations can have a different contact pattern, or one or more different contact patterns can be used in the selected block locations.

BRIEF DESCRIPTION OF THE DRAWINGS

Embodiments of the invention are better understood with reference to the following drawings. The elements of the drawings are not necessarily to scale relative to each other.

ADVANTAGEOUS EFFECTS

One advantage of the present invention is to make contact locations or patterns in an image sensor pixel array less detectable under all illumination conditions. The present invention also reduces or minimizes the risk of electrical shorts between contacts.

DETAILED DESCRIPTION

Throughout the specification and claims the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Additionally, directional terms such as "on", "over", "top", "bottom", "left", "right", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements.

Referring to the drawings, like numbers indicate like parts throughout the views.

Figure 5:
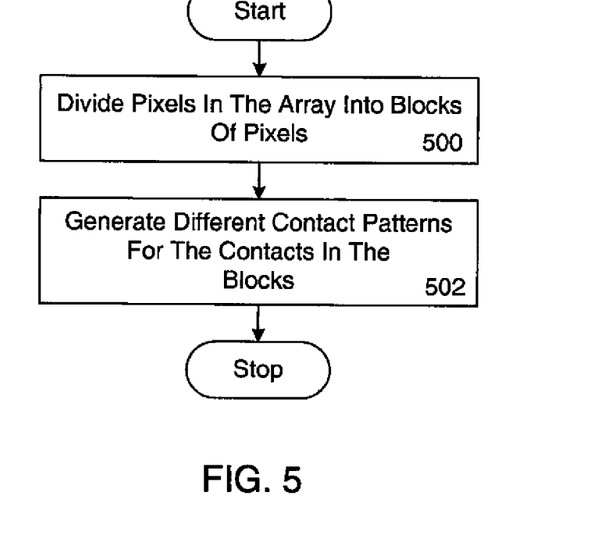
FIG. 5 is a flowchart of a first method for determining locations for contacts in a pixel array in an embodiment in accordance with the invention.

FIG. 5 is a flowchart of a method for determining locations for contacts in a pixel array in an embodiment in accordance with the invention. Initially, the pixels in the pixel array are grouped into blocks of pixels (block 500). In one embodiment in accordance with the invention, the blocks of pixels include two or more pixels. The number of pixels in each block is based on the number of pixels in the pixel array, the sheet resistances of the electrodes and conductive strips, and the targeted driving pulse width in an embodiment in accordance with the invention. Additionally, the blocks can be configured in any given arrangement or orientation. The pixels in each block can be arranged in a square configuration, a rectangular configuration, or any other shape or arrangement.

Next, as shown in block 502, different contact patterns are generated for the contacts in all of the blocks, or in substantially all of the blocks. The contact pattern in a portion of the blocks (one or more blocks) should differ from the contact pattern for at least one other discrete portion of blocks (one or more blocks).

Each contact pattern is randomly generated using a program running on a computing device in an embodiment in accordance with the invention. Other embodiments in accordance with the invention can produce the different contact patterns using alternate techniques. For example, the different contact patterns can include a collection of known different contact patterns that are assigned to the respective blocks in the portion of the pixel array.

In a pixel array having rows and columns of pixels, the following principles govern the generation of contact locations in the blocks in an embodiment in accordance with the invention. Inside each block, at any given row of pixels, only a single electrode in one pixel is connected to a conductive strip by a contact. Inside each block, at any given column of pixels, only a single electrode in one pixel is connected to a conductive strip by a contact. Inside a block, the contacts are separated by at least one pixel. Inside the blocks that are immediately adjacent to one another vertically, the same electrodes are connected to a conductive strip by a contact. Inside the blocks that are immediately adjacent to one another horizontally, alternate electrodes are connected to conductive strips by contacts. And finally, the contacts within the blocks and between neighboring blocks are separated from each other by at least one pixel. Other embodiments in accordance with the invention can use additional principles, or different principles from the described principles, or no principles when determining the contact locations in the pixel array.

Because the contact patterns are randomly generated, one or more contact patterns may match or be duplicates of each other. Thus, different contact patterns may not be generated for all of the blocks in the pixel array, but rather for substantially all of the blocks.

FIGS. 6-10, 12, and 14 illustrate alternate implementations of pixel arrays in embodiments in accordance with the invention. Each implementation is described as having a given number of electrodes disposed over each pixel and a certain number of pixels in the blocks of pixels. Other embodiments in accordance with the invention, however, are not limited to these specifications. A pixel array can dispose any number of electrodes over each pixel. By way of example only, a pixel array can provide one or four electrodes over each pixel.

Similarly, a pixel array can include any number of pixels in each block of pixels. And the blocks can be configured into any given shape or orientation. For example, a block of pixels can be arranged in a square or rectangular shape.

Figure 6:
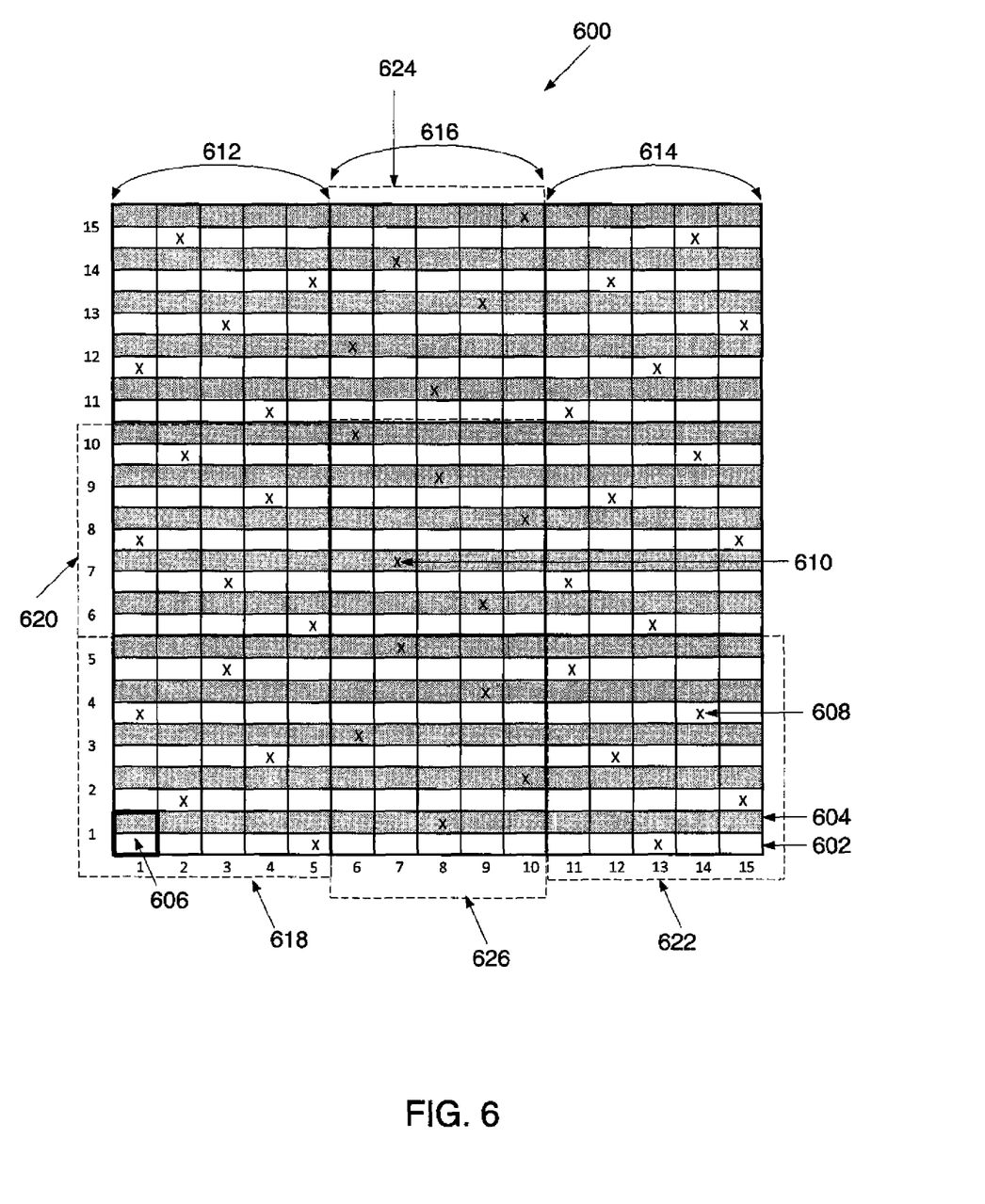
FIG. 6 is a simplified top view of a portion of a pixel array in an embodiment in accordance with the invention.

Referring now to FIG. 6, there is shown a simplified top view of a portion of a pixel array in an embodiment in accordance with the invention. Pixel array 600 includes two electrodes 602, 604 disposed over each pixel 606. Contacts 608, 610 are used to connect respective electrodes 602, 604 to conductive strips (not shown in FIG. 6). All of the contacts 608 in column groups 612, 614 are connected to electrode 602, while the contacts 610 in column group 616 are connected to electrode 604.

The portion of pixel array 600 shown in FIG. 6 includes fifteen rows and fifteen columns of pixels 606. The pixels 606 are grouped into blocks of twenty-five pixels (five rows of pixels by five columns of pixels, or 5×5 blocks). Thus, the portion shown in FIG. 6 includes a total of nine 5×5 blocks. The contact patterns used in the blocks are randomly generated for each block. For example, in block 618 in column group 612, electrodes 602 are connected to conductive strips in row 1 and column 5; row 2 and column 2; row 3 and column 4; row 4 and column 1; and row 5 and column 3. In block 620 in the same column group 612, electrodes 602 are connected to conductive strips in row 6 and column 5; row 7 and column 3; row 8 and column 1; row 9 and column 4; and row 10 and column 2.

In block 622 in column group 614, electrodes 602 are connected to conductive strips in row 1 and column 13; row 2 and column 15; row 3 and column 12; row 4 and column 14; and row 5 and column 11. As shown in FIG. 6, the contact patterns in blocks 618, 620, 622 are different from each other.

Within column group 616, electrodes 604 in block 624 are connected to conductive strips in row 11 and column 8; row 12 and column 6; row 13 and column 9; row 14 and column 7; and row 15 and column 10. Note that in the same column group 616, the contact pattern in block 624 differs from the contact pattern in block 626. Moreover, all of the contact patterns in blocks 618, 620, 622, 624 and 626 differ from each other. The random contact patterns reduce or eliminate visible patterns that can be detected easily by the human eye.

Additionally, across pixel array 600, all of the contacts are separated from each other by at least one pixel. This separation improves manufacturing yields because the risk of electrical shorts between contacts is reduced or eliminated.

Figure 7:
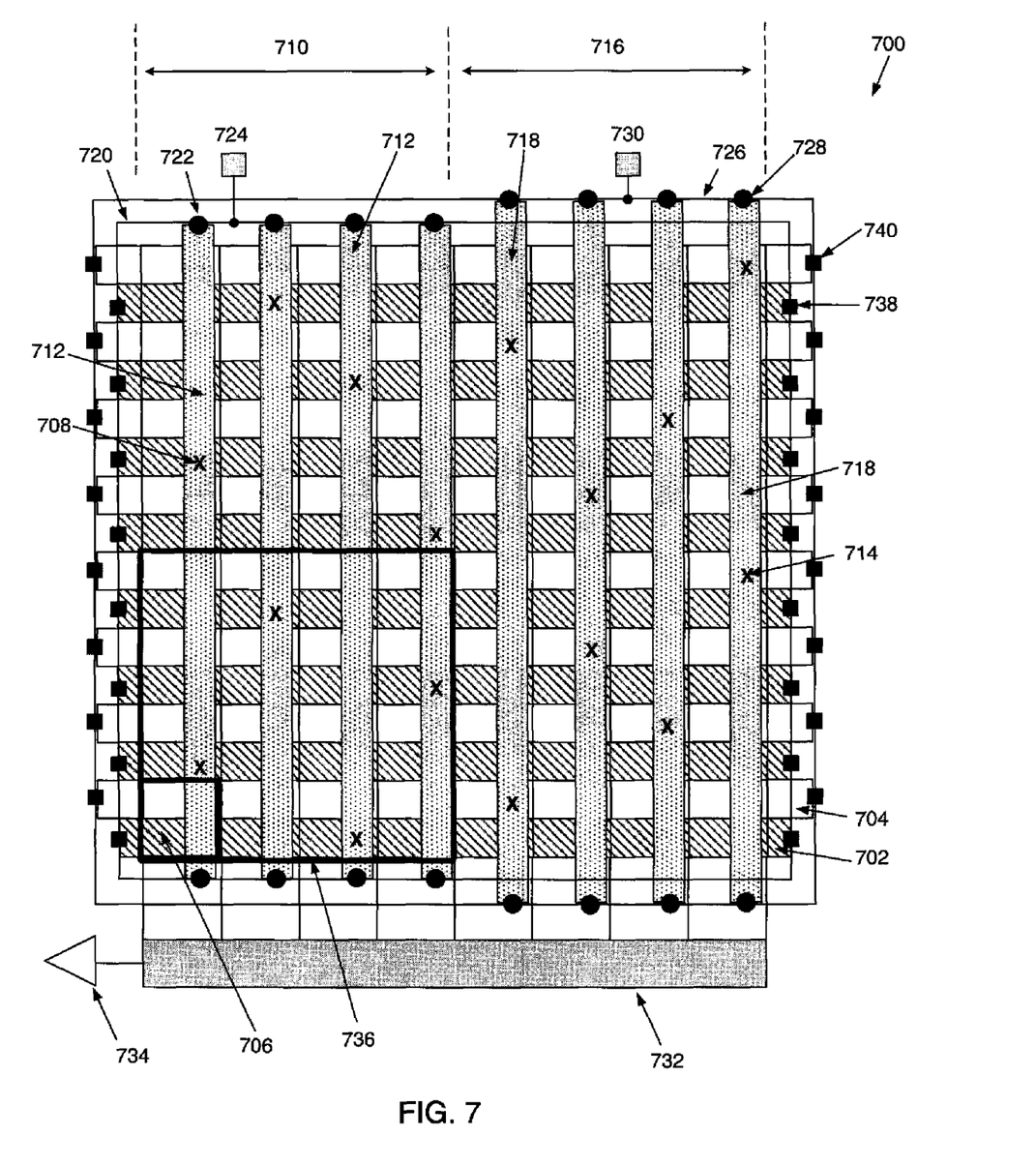
FIG. 7 is a simplified top view of a portion of a first full frame pixel array in an embodiment in accordance with the invention.

FIG. 7 is a simplified top view of a portion of a first full frame pixel array in an embodiment in accordance with the invention. Pixel array 700 includes two electrodes 702, 704 disposed over each pixel 706. Each contact 708 in column group 710 is connected to electrode 702 and conductive strip 712, while each contact 714 in column group 716 is connected to electrode 704 and conductive strip 718.

Conductive strips 712, 718 are disposed over electrodes 702, 704. Conductive strips 712, 718 are uniform and extend across pixel array 700. Conductive strips 712, 718 are disposed substantially perpendicular to electrodes 702, 704 in an embodiment in accordance with the invention. Other embodiments in accordance with the invention can dispose the conductive strips over the electrodes with a different orientation with respect to the electrodes.

The portion of pixel array 700 shown in FIG. 7 includes eight rows and eight columns of pixels 706. The pixels are grouped into 4×4 blocks of pixels. Thus, the portion includes a total of four 4×4 blocks 736 of pixels. The contact patterns in the four blocks differ from one another. The different contact patterns reduce or eliminate visible patterns that can be detected easily by the human eye. The contact pattern in each block is randomly generated using a software program running on a computing device in an embodiment in accordance with the invention. Other embodiments in accordance with the invention can determine the different contact patterns using alternate techniques.

Bus lines 720, 726 are formed along the periphery of pixel array 700. Conductive strips 712 are connected to bus line 720 via contacts 722. Bus line 720 is connected to bond pad 724. Both ends of electrodes 702 are connected to bus line 720 via contacts 738.

Similarly, conductive strips 718 are connected to bus line 726 via contacts 728. Bus line 726 is connected to bond pad 730. Both ends of electrodes 704 are connected to bus line 726 via contacts 740. The driving pulses applied to bond pads 724, 730 are transmitted to electrodes 702, 704, respectively, from both left and right ends of the electrodes via contacts 738, 740, as well as from contacts 708, 714 to conductive strips 712, 718. The driving pulses are used to shift or transfer charge out of pixel array 700 (on a row-by-row basis) to horizontal shift register 732. Horizontal register 732 then serially shifts the charge to output circuit 734.

Conductive strips 712, 718 are made of metal and electrodes 702, 704 of polysilicon in an embodiment in accordance with the invention. The degradation of the driving pulse waveforms is reduced because the sheet resistance of the metal conductive strips is smaller than the sheet resistance of the polysilicon.

Figure 8:
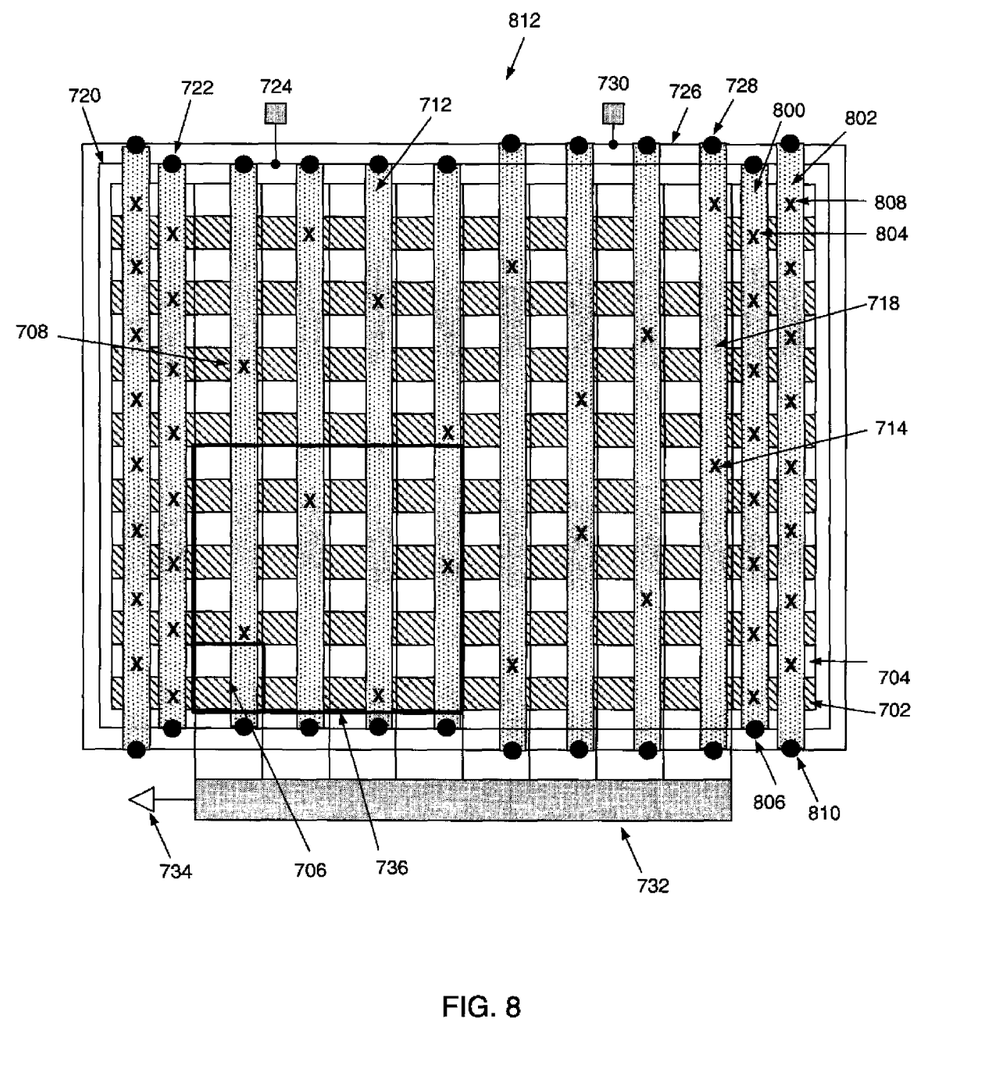
FIG. 8 is a simplified top view of a portion of a second full frame pixel array in an embodiment in accordance with the invention.

Referring now to FIG. 8, there is shown a block diagram of an image sensor 800 in another embodiment in accordance with the invention. The embodiment illustrated in FIG. 8 is similar to the embodiment depicted in FIG. 7 except that both ends of electrodes 702, 704 are connected to bus lines 720, 726 by conductive strips 800, 802, respectively.

Conductive strips 800, 802 are made of a metal in an embodiment in accordance with the invention. Conductive strips 800, 802 are disposed substantially perpendicular to electrodes 702, 704 in the illustrated embodiment. Other embodiments in accordance with the invention can dispose the conductive strips over the electrodes with a different orientation with respect to the electrodes.

Electrodes 702 are connected to conductive strip 800 via contacts 804. Conductive strip 800 is connected to bus line 720 via contacts 806. Similarly, electrodes 704 are connected to conductive strips 802 via contacts 808. Conductive strips 802 are connected to bus line 726 via contacts 810.

Since conductive strips 712, 718, 800, 802 can be made from the same material, the pixels in the center of array 812 and at both ends of the array 812 have relatively the same electrical properties like resistance and capacitance.

Figure 9:
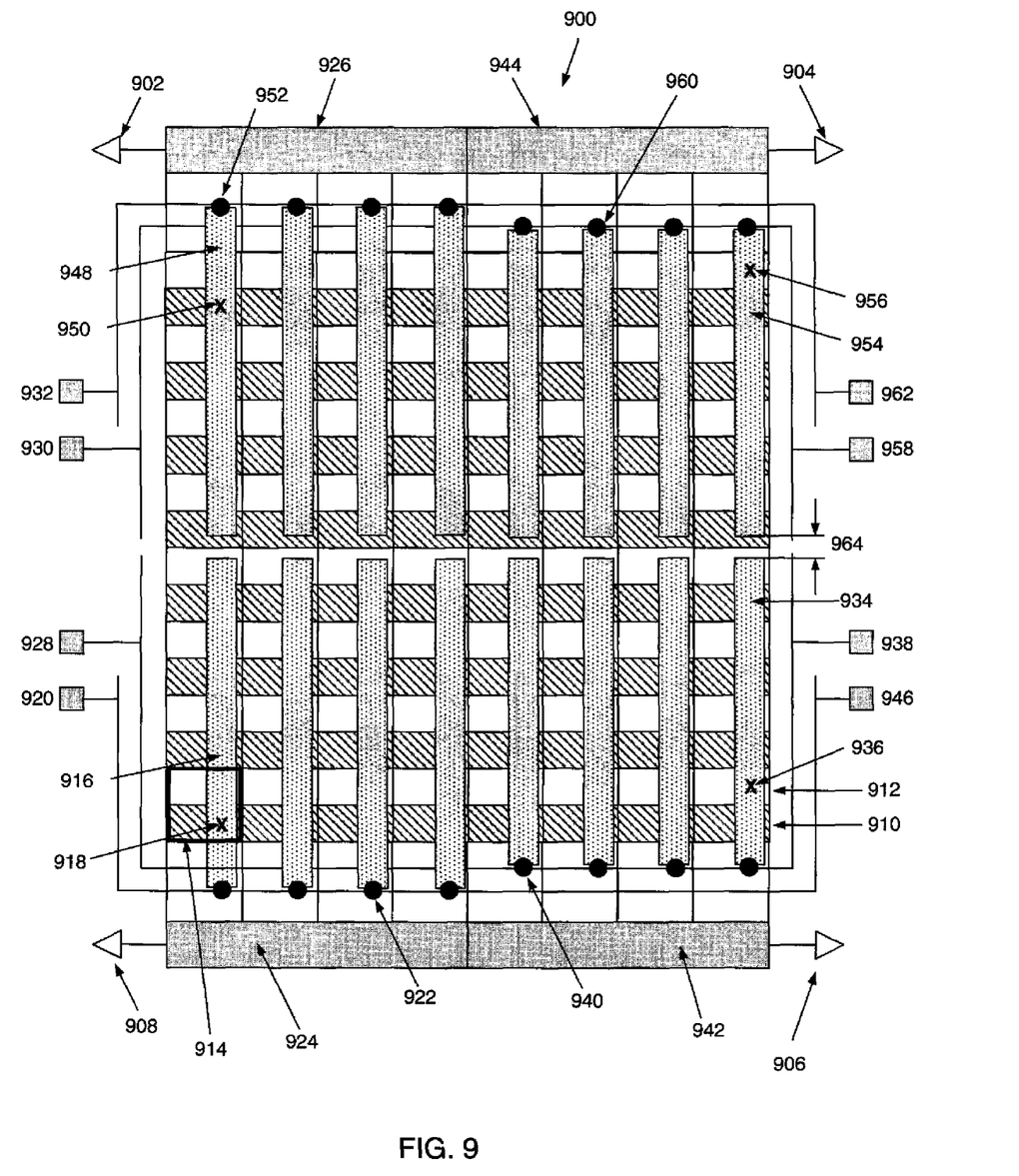
FIG. 9 is a simplified top view of a portion of a third full frame pixel array in an embodiment in accordance with the invention.

FIG. 9 is a simplified top view of a portion of a third full frame pixel array in an embodiment in accordance with the invention. Image sensor 900 has four output circuits 902, 904, 906, 908. Two electrodes 910, 912 are disposed over each pixel 914. In the lower left quadrant of image sensor 900, electrodes 910 are connected to conductive strips 916 via contacts 918. Conductive strips 916 are electrically connected to bond pad 920 via contacts 922. To simplify the drawing, only one contact 918 is shown. The charge can be transferred to either horizontal register 924 or horizontal register 926, depending on the clocking signals applied to bond pads 920, 928, 930, 932.

Similarly, in the lower right quadrant of pixel array 900, electrodes 912 are connected to conductive strips 934 via contacts 936. Conductive strips 934 are electrically connected to bond pad 938 via contacts 940. Again, only one contact 936 is shown in the figure. The charge in the lower right quadrant of pixel array 900 can be transferred to either horizontal register 942 or horizontal register 944.

In the FIG. 9 embodiment, bond pads 920, 946 are connected together and bond pads 928, 938 are connected together. One advantage to this construction is the waveform degradation of the driving pulses is reduced because the driving pulses are applied to the bond pads from both sides of pixel array 900.

The upper left quadrant in pixel array 900 connects electrodes 910 to conductive strips 948 via contacts 950. Conductive strips 948 are connected to bond pad 932 via contacts 952. The upper right quadrant in pixel array 900 connects electrodes 912 to conductive strips 954 via contacts 956. Conductive strips 954 are connected to bond pad 958 via contacts 960. Bond pads 932, 962 are connected together and bond pads 930, 958 are connected together.

Conductive strips 916, 934, 948, 954 are disposed over electrodes 910, 912. Conductive strips 916, 934, 948, 954 extend over only portions of pixel array 900. Conductive strips 916, 934, 948, 954 are disposed substantially perpendicular to electrodes 910, 912 in an embodiment in accordance with the invention. Other embodiments in accordance with the invention can dispose the conductive strips over the electrodes with a different orientation with respect to the electrodes.

Conductive strips 916, 948 are not connected to each other, and conductive strips 934, 954 are not connected to each other. Bond pads 920, 928, 930, 932 are not connected together, and bond pads 938, 946, 958, 962 are not connected together. A gap 964 physically exists between the conductive strips 948, 954 in the upper quadrants and the conductive strips 916, 934 in the lower quadrants. Gap 964 allows the charge transfer to be bi-directional using techniques known in the art. Charge in pixel array 900 can be read out to one output circuit 902, 904, 906, or 908, to two output circuits 902 and 904, 906 and 908, 902 and 908, or 904 and 906, or to all four output circuits 902, 904, 906, 908. The direction of charge transfer through pixel array 900 depends on the waveforms of the driving pulses transmitted to the electrodes in each quadrant. The direction of charge transfer through the horizontal registers 926, 944 and horizontal registers 924, 942 depends on the waveforms of the horizontal driving pulses applied to the distinct electrodes (not shown) disposed over the horizontal registers.

Figure 10:
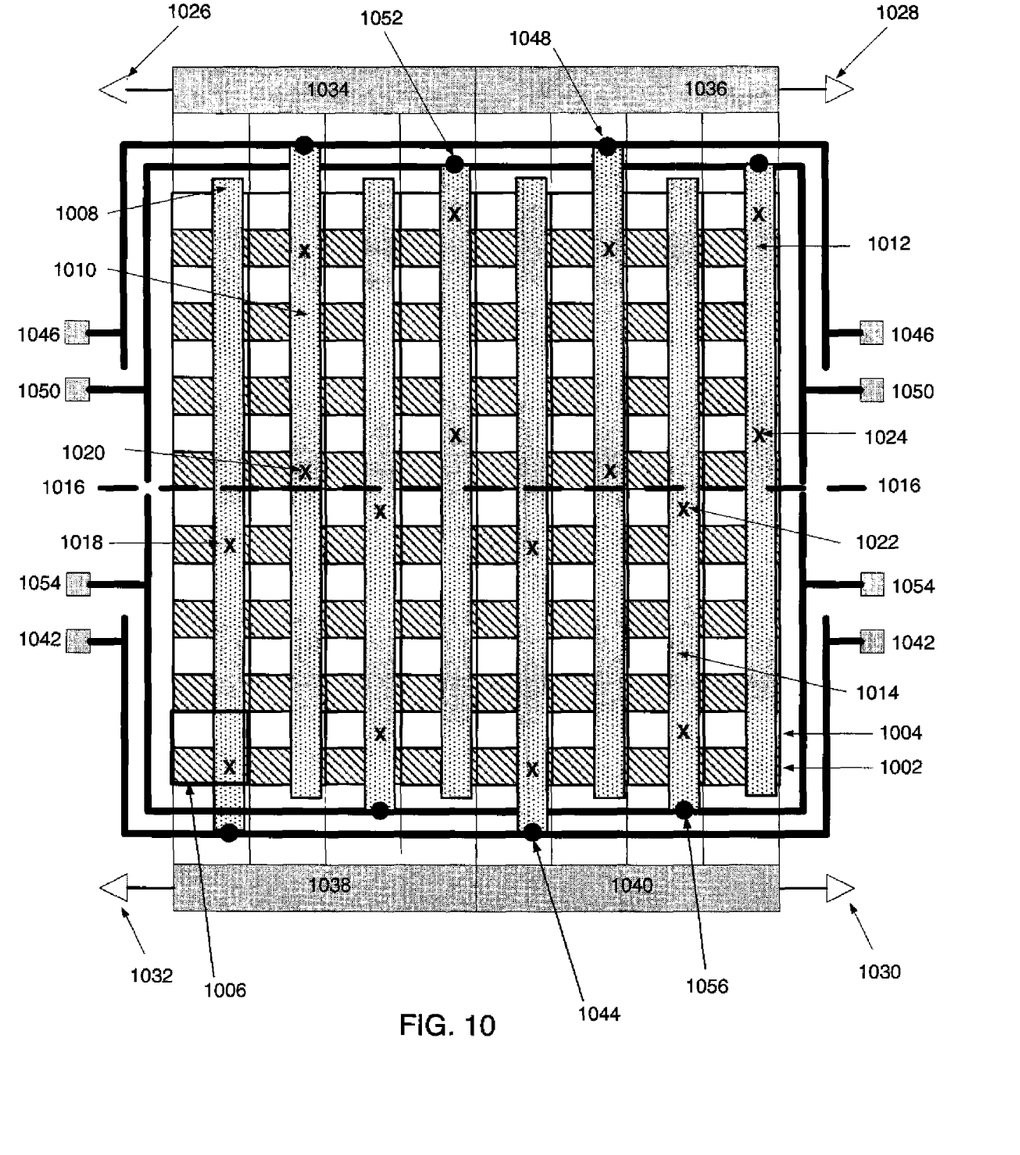
FIG. 10 is a simplified top view of a portion of a fourth full frame pixel array in an embodiment in accordance with the invention.

Referring now to FIG. 10, there is a simplified top view of a portion of a fourth full frame pixel array in an embodiment in accordance with the invention. Pixel array 1000 has two electrodes 1002, 1004 disposed over each pixel 1006. Conductive strips 1008, 1010, 1012, 1014 are disposed over electrodes 1002, 1004. Conductive strips 1008, 1010, 1012, 1014 and are uniform and extend across pixel array 1000. Conductive strips 1008, 1010, 1012, 1014 are disposed substantially perpendicular to the electrodes in the illustrated embodiment. Other embodiments in accordance with the invention can dispose the conductive strips over the electrodes with a different orientation with respect to the electrodes.

The center of pixel array 1000 is indicated by a dash line 1016. The connections between electrodes 1002, 1004 and conductive strips 1008, 1010, 1012, 1014 are implemented to allow for bi-directional readout of pixel array 1000. For clarity, only a limited number of contacts are shown in FIG. 10. Electrodes 1002 located in the lower half of pixel array 1000 are connected to conductive strips 1008 via contacts 1018. In the upper half of pixel array 1000, electrodes 1002 are connected to conductive strips 1010 via contacts 1020. There are no contacts between electrodes 1002 and conductive strips 1008 in the upper half of pixel array 1000 and there are no contacts between electrodes 1002 and conductive strips 1010 in the lower half of pixel array 1000.

Electrodes 1004 located in the lower half of pixel array 1000 are connected to conductive strips 1014 via contacts 1022. In the upper half of pixel array 1000, electrodes 1004 are connected to conductive strips 1012 via contacts 1024. There are no contacts between electrodes 1004 and conductive strips 1014 in the upper half of pixel array 1000 and there are no contacts between electrodes 1004 and conductive strips 1012 in the lower half of pixel array 1000.

Conductive strips 1008 are connected to bond pad 1042 via contacts 1044. Conductive strips 1010 are connected to bond pad 1046 via contacts 1048. Conductive strips 1012 are connected to bond pad 1050 via contacts 1052. And conductive strips 1014 are connected to bond pads 1054 via contacts 1056. Bond pads 1050 are not connected to bond pads 1054.

Charge in pixel array 1000 can be read out to one output circuit 1026, 1028, 1030, or 1032, to two output circuits 1026 and 1028, 1030 and 1032, 1026 and 1032, or 1028 and 1030, or to all four output circuits 1026, 1028, 1030 or 1032. The direction of charge transfer through pixel array 1000 depends on the waveforms of the driving pulses transmitted to the electrodes 1002, 1004. The direction of charge transfer through the horizontal registers 1034, 1036 and horizontal registers 1038, 1040 depends on the waveforms of the horizontal driving pulses applied to the distinct electrodes (not shown) disposed over the horizontal registers. The arrangement eliminates the gap in the middle shown in FIG. 9.

Figure 11:
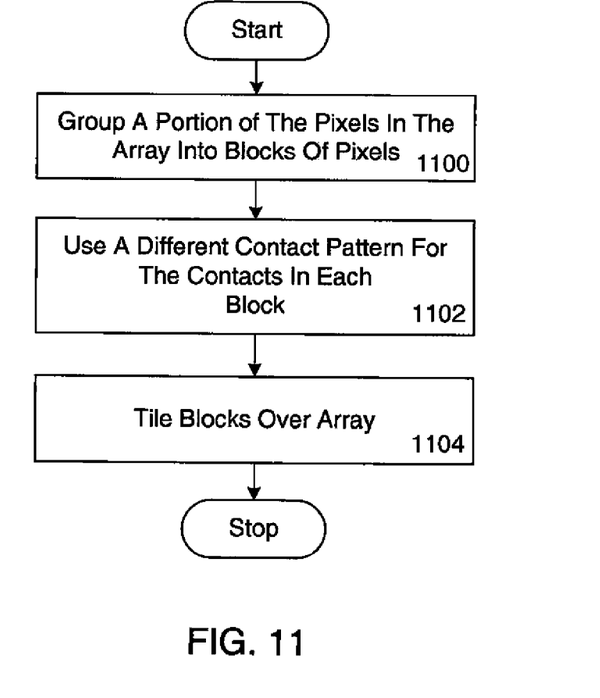
FIG. 11 is a flowchart of a second method for determining locations for contacts in a pixel array in an embodiment in accordance with the invention.

FIG. 11 is a flowchart of a second method for determining locations for contacts in a pixel array in an embodiment in accordance with the invention. Initially, a portion of a pixel array is grouped into blocks of pixels (block 1100). The blocks of pixels can include any number of pixels and be configured in any given shape or orientation. The number of blocks of pixels produced in block 1100 depends on the number of pixels in the pixel array, the number of pixels in each block, the sheet resistances of the electrodes and conductive strips, and the targeted driving pulse width in an embodiment in accordance with the invention.

A different contact pattern is then produced for the contacts in each block, or for the contacts in substantially each block, as shown in block 1102. The contact patterns are randomly generated using a software program running on a computing device in an embodiment in accordance with the invention. Other embodiments in accordance with the invention can generate the different contact patterns using alternate techniques. For example, the different contact patterns can be selected from various known contact patterns in another embodiment in accordance with the invention.

If the contact patterns are randomly generated, one or more contact patterns may match or be duplicates of each other. Thus, different contact patterns may not be generated for all of the blocks in the portion of the pixel array, but rather for substantially all of the blocks.

Next, as shown in block 1104, the blocks are tiled, or repeatedly used in an ordered placement, over the entire array. The different contact patterns reduce or eliminate visible patterns that can be detected easily by the human eye.

Figure 12:
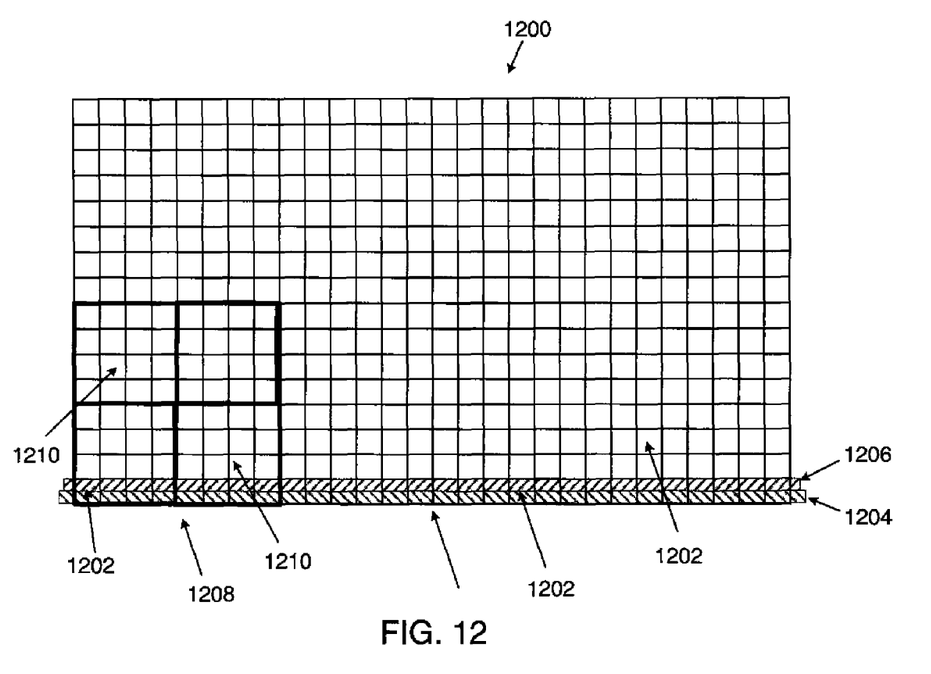
FIG. 12 is a simplified top view of a portion of a pixel array in an embodiment in accordance with the invention.

Referring now to FIG. 12, there is shown a simplified top view of a portion of a pixel array in an embodiment in accordance with the invention. Pixel array 1200 includes multiple pixels 1202 with two electrodes 1204, 1206 disposed over each pixel 1202. For simplicity, only two electrodes are illustrated in the figure. The pixels in region 1208 are divided into blocks 1210 of pixels 1202. For simplicity, the pixels have been divided into four blocks 1210 each block including a total of sixteen pixels (4 rows of pixels by 4 columns of pixels).

In each block 1210, different contact patterns are utilized for the contacts (not shown in FIG. 12) between the electrodes 1204, 1206 and conductive strips (not shown in FIG. 12). All of the contact patterns in region 1208 are then tiled over the entire pixel array 1200. The different contact patterns reduce or eliminate visible patterns that can be detected by the human eye.

Figure 13:
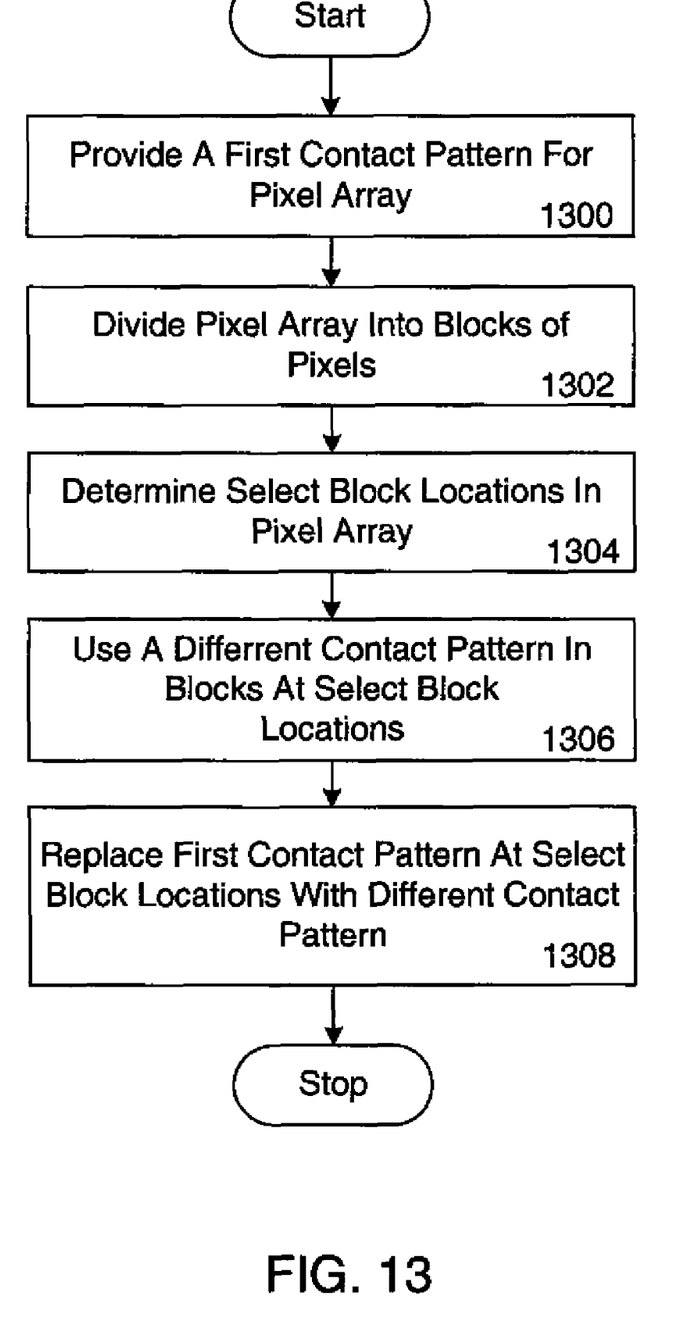
FIG. 13 is a flowchart of a third method for determining locations for contacts in a pixel array in an embodiment in accordance with the invention.

FIG. 13 is a flowchart of a third method for determining locations for contacts in a pixel array in an embodiment in accordance with the invention. Initially, as shown in block 1300, a first contact pattern is utilized for the contacts between the electrodes and conductive strips. The first contact pattern can be any known or given contact pattern.

The pixels in the pixel array are then grouped into blocks, as shown in block 1302. Next, as shown in block 1304, select block locations within the pixel array are randomly determined in an embodiment in accordance with the invention. Other embodiments can determine block locations using alternate techniques. For example, the block locations can be established based on the locations of image artifacts produced by the first contact pattern.

One or more different contact patterns are then used in the blocks located at the randomly determined block locations (block 1306). The different contact patterns can be randomly generated for each block or for some of the blocks, or any known contact pattern or patterns can be used in the blocks.

The first contact pattern in the select block locations is replaced with a different contact pattern (block 1308). The number of blocks, the number of pixels in each block, and the number of select block locations depend on the number of pixels in the pixel array, the number of pixels in each block, the sheet resistances of the electrodes and conductive strips, and the targeted driving pulse width in an embodiment in accordance with the invention.

Figure 14:
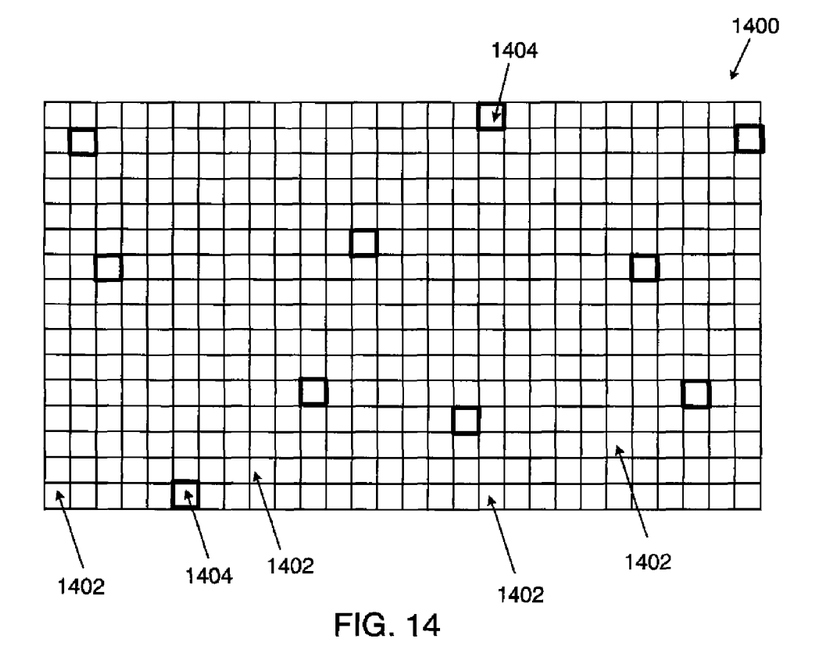
FIG. 14 is a simplified top view of a portion of a pixel array in an embodiment in accordance with the invention.

Referring now to FIG. 14, there is shown a simplified top view of a portion of a pixel array in an embodiment in accordance with the invention. Pixel array 1400 includes blocks 1402 of pixels. A first or known contact pattern (not shown in FIG. 14) is used in pixel array 1400. Select block locations 1404 are determined and a different contact pattern (not shown) is for the contacts (not shown in FIG. 14) between the electrodes and conductive strips (not shown in FIG. 14) in the select block locations. The different contact patterns in the select block locations 1404 reduce or eliminate visible patterns that can be detected easily by the human eye.

In summary, embodiments of the invention utilize two or more different contact patterns across a pixel array for contacts between selected electrodes and respective conductive strips. The two or more different contact patterns are intermingled or mixed together to reduce or eliminate the visible patterns that can be detected by the human eye. The different contact patterns can be used to break up or disperse some or all of the visible contact patterns. The different contact patterns can result in a non-uniform pattern of contacts for portions of the array or for the entire array, an unpredictable pattern of contacts for portions of the array or for the entire array, or a non-tileable pattern of contacts for portions of the array or for the entire array.

The contact locations can be separated from each other by at least one pixel. When the pixel array is configured in rows and columns, at any given row of pixels, only one pixel can include a contact between a single electrode and a conductive strip. At any given column of pixels, only one pixel can include a contact between a single electrode and a conductive strip. Inside the blocks, contacts can be provided between the conductive strips and the same electrodes.

The invention has been described in detail with particular reference to certain preferred embodiments thereof, but it will be understood that variations and modifications can be effected within the spirit and scope of the invention. Additionally, even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible. For example, in FIG. 10, instead of having only one conductive strip connected at the bottom of the pixel array and one conductive strip connected at the top, other embodiments in accordance with the invention can connect two or more conductive strips to the same electrode from the bottom and two conductive strips to same electrode from the top.

PARTS LIST 100 pixel array
102 photosensitive area
104 electrode
106 electrode
108 line representing center of pixel array
200 contact
202 contact
204 contact
206 contact
208 electrode
210 electrode 212 electrode
214 electrode
216 metal wiring
218 pixel array
220 pixel
300 pixel array
302 pixel
304 electrode
306 electrode
308 metal strip
310 contact
312 metal strip
314 contact
316 bond pad
318 bond pad
320 block of pixels
400 pixel array
402 electrode
404 electrode
406 pixel
408 contact
410 contact
412 column group
414 column group
416 block of pixels
418 block of pixels
600 pixel array
602 electrode
604 electrode
606 pixel
608 contact
610 contact
612 column group
614 column group
616 column group
618 block of pixels
620 block of pixels
622 block of pixels
624 block of pixels
626 block of pixels
700 pixel array
702 electrode
704 electrode
706 pixel
708 contact
710 column group
712 conductive strip
714 contact
716 column group
718 conductive strip
720 bus line
722 contact
724 bond pad
726 bus line
728 contact
730 bond pad
732 horizontal shift register
734 output circuit
736 block of pixels
738 contact
740 contact
800 conductive strip
802 conductive strip
804 contact
806 contact
808 contact
810 contact 812 pixel array
900 pixel array
902 output circuit
904 output circuit
906 output circuit
908 output circuit
910 electrode
912 electrode
914 pixel
916 conductive strip
918 contact
920 bond pad
922 contact
924 horizontal shift register
926 horizontal shift register
928 bond pad
930 bond pad
932 bond pad
934 conductive strip
936 contact
938 bond pad
940 contact
942 horizontal shift register
944 horizontal shift register
946 bond pad
948 conductive strip
950 contact
952 contact
954 conductive strip
956 contact
958 bond pad
960 contact
962 bond pad
964 gap
1000 pixel array
1002 electrode
1004 electrode
1006 pixel
1008 conductive strip
1010 conductive strip
1012 conductive strip
1014 conductive strip
1016 dashed line representing middle of pixel array
1018 contact
1020 contact
1022 contact
1024 contact
1026 output circuit
1028 output circuit
1030 output circuit
1032 output circuit
1034 horizontal shift register
1036 horizontal shift register
1038 horizontal shift register
1040 horizontal shift register
1042 bond pad
1044 contact
1046 bond pad
1048 contact
1050 bond pad
1052 contact
1054 bond pad
1056 contact
1200 pixel array
1202 pixel
1204 electrode
1206 electrode 1208 region
1210 block
1400 pixel array
1402 block
1404 selected block locations
V1 driving pulse
V2 driving pulse

What is claimed is:

1. A method for determining contact locations in a pixel array, wherein the pixel array includes a plurality of pixels, one or more electrodes disposed over each pixel, and a plurality of conductive strips disposed over the electrodes, wherein contacts are formed between selected electrodes and respective conductive strips at the contact locations, the method comprising:

grouping the plurality of pixels into two or more blocks of pixels; and providing different contact patterns for the contacts in substantially all of the blocks of pixels.

2. The method as in claim 1, wherein providing different contact patterns for the contacts in substantially all of the blocks of pixels comprises randomly generating a contact pattern for each block of pixels.

3. The method as in claim 1, wherein providing different contact patterns for the contacts in substantially all of the blocks of pixels comprises providing contact locations that are separated from each other by at least one pixel.

4. The method as in claim 1, wherein the pixel array is arranged in a plurality of rows and columns.

5. The method as in claim 1, wherein providing different contact patterns for the contacts in substantially all of the blocks of pixels comprises providing, at any given row of pixels, only one pixel including a contact between a single electrode and a conductive strip.

6. The method as in claim 1, wherein providing different contact patterns for the contacts in substantially all of the blocks of pixels comprises providing, at any given column of pixels, only one pixel including a contact between a single electrode and a conductive strip.

7. The method as in claim 1, wherein providing different contact patterns for the contacts in substantially all of the blocks of pixels comprises, inside each block, providing contacts between the conductive strips and the selected electrodes.

\* \* \* \* \*